(12) United States Patent
Kalnitsky et al.

(10) Patent No.: US 6,861,324 B2
(45) Date of Patent: Mar. 1, 2005

(54) METHOD OF FORMING A SUPER SELF-ALIGNED HETERO-JUNCTION BIPOLAR TRANSISTOR

(75) Inventors: Alexander Kalnitsky, Portland, OR (US); Michael Rowlandson, Portland, OR (US); Ken Liao, Beaverton, OR (US); Robert F. Scheer, Portland, OR (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 173 days.

(21) Appl. No.: 09/882,538

(22) Filed: Jun. 15, 2001

(65) Prior Publication Data

US 2002/0192894 A1 Dec. 19, 2002

(51) Int. Cl.[7] .................... H01L 21/331; H01L 21/8222
(52) U.S. Cl. ......................... 438/320; 257/565
(58) Field of Search ................ 257/197, 198, 257/565, 511, 312, 309, 207; 438/309, 320, 339, 364, 365, 370, 372, 377, 340, 343, 369, 205, 317

(56) References Cited

U.S. PATENT DOCUMENTS

| 3,242,018 | A | 3/1966 | Crabmaier et al. |
| 4,122,476 | A | 10/1978 | Hovel et al. |
| 4,255,755 | A | 3/1981 | Itoh et al. |
| 4,379,005 | A | 4/1983 | Hovel et al. |
| 4,935,797 | A | 6/1990 | Jambotkar |
| 5,962,879 | A | 10/1999 | Ryum et al. |
| 6,323,530 | B1 * | 11/2001 | Kubota ........................ 257/466 |
| 6,337,494 | B1 * | 1/2002 | Ryum et al. ................. 257/197 |
| 6,436,781 | B2 * | 8/2002 | Sato ........................... 438/350 |

FOREIGN PATENT DOCUMENTS

JP 406333937 A * 12/1994

OTHER PUBLICATIONS

Ben G. Streetman and Sanjay Banejee, Solid State Electronic Devices 2000, Prentice Hall, Inc., 5th Edition, pp. 2, 149, 155.*

D.L. Harame, et al., "Si/SiGe Epitaxial–Base Transistors—Part II: Process Integration and Analog Applications", IEEE, (pub. vol. 42, No. 3, Mar. 1995), pp. 469–482.

* cited by examiner

Primary Examiner—Long Pham
Assistant Examiner—Dana Farahani
(74) Attorney, Agent, or Firm—Perkins Coie LLP

(57) ABSTRACT

The present invention provides a method of forming a super self-aligned bipolar transistor with enhanced electrical characteristics. The power gain and frequency response of the transistor are improved by horizontally etching an area for the base region that is wider than the active emitter and collector regions. By removing polysilicon layers within the device, the base region resistance goes down and unwanted capacitive effects are reduced.

15 Claims, 9 Drawing Sheets

METHOD OF FORMING A SUPER SELF-ALIGNED HETERO-JUNCTION BIPOLAR TRANSISTOR

CROSS-REFERENCE TO RELATED APPLICATIONS

Not applicable.

STATEMENT REGARDING FEDERALLY SPONSORED RESEARCH

Not applicable.

FIELD OF THE INVENTION

The present invention relates to semiconductor integrated circuit devices, and more particularly to forming super self-aligned hetero-junction bipolar transistors.

BACKGROUND OF THE INVENTION

Bipolar transistors are commonly used in semiconductor devices, especially for high-speed operation and large drive current and low 1/f noise applications. Largely because of these features, heterojunction bipolar transistors (HBTs) are used in products such as integrated switching devices and microwave devices, e.g., in wireless communications, satellite direct broadcast systems, automobile collision avoidance systems, global positioning systems, and other high-frequency applications. Heterojunction bipolar transistors (HBTs) theoretically provide advantages over conventional homojunction bipolar transistors by providing a heterojunction between a base and emitter of a transistor. A heterojunction is formed between two dissimilar semiconductor materials and there will be a bandgap discontinuity between these two materials. A Silicon (Si) homojunction has no bandgap discontinuity at the junction. From the perspective of an NPN transistor, discontinuity in the valence band at the emitter base junction restricts hole flow from the base to the emitter, thus improving emitter injection efficiency and current gain. A discontinuity at the collector base junction outside the space charge region (SCR) can lead to charge pile-up and produce an undesirable buildup of minority carriers in the base. To the extent that injection efficiency and current gain improvements can be achieved, base region resistivity may be lowered (which lowers the base resistance) and emitter region resistivity may be raised (which lowers base-emitter junction capacitance) to create fast transistors without significantly compromising other device parameters. Such fast transistors would be useful for high speed digital, microwave and other integrated circuit and discrete transistor applications.

In practice, HBT performance often falls far short of the theoretical expectations. One conventional Si-based HBT reduces the bandgap of the base region by creating a base material having a narrower bandgap than Si. In particular, a small amount of germanium (Ge) is mixed with Si in the base (Si—xGex), and the emitter is more purely Si. Unfortunately, the amount of bandgap difference (.DELTA.Eg) for as much as 20% Ge content in the base is only about 0.15 eV. This small .DELTA.Eg achieves only a small portion of the performance benefits that HBTs theoretically promise.

Slight improvements in HBT performance have been achieved by using materials other than Si for the emitter of an HBT. Three emitter materials which have been investigated for use in HBT transistors are silicon carbide (SiC), which has a bandgap of 2.93 eV, gallium arsenide (GaAs) which has a bandgap of 1.42 eV, and gallium phosphide (GaP), which has a bandgap of 2.24 eV. Unfortunately, such materials have lattice constants which differ from Si. For example, SiC has a 20% lattice mismatch, GaAs has a 4% lattice mismatch, and GaP has a 0.34% lattice mismatch. Likewise, such materials have thermal expansion coefficients which differ from Si. Si has a thermal expansion coefficient of around 2.6.times.10.sup.−6 (.degree. C.)−1, while GaAs has a thermal expansion coefficient of around 6.7.times.10.sup.−6 (.degree. C.)−1, and GaP has a thermal expansion coefficient of around 5.91.times.10.sup.−6 (.degree. C.)−1. Because of these differences, only thin layers of these materials have been successfully grown on Si without the formation of significant defects. The maximum thickness for a low defect layer of SiC grown on Si is only a few angstroms (.ANG.) and for GaAs grown on Si is less than 200 ANG. At these thicknesses or less, strain which is caused by lattice mismatch is contained by lattice stretching rather than crystal defects. Thinner, low-defect thicknesses of these materials do not possess a sufficient thickness to protect the base-emitter junction from shorting due to diffusion of metal from the emitter contact region. Thicker, high-defect thicknesses of these materials exhibit degraded junction performance due to an excessive number of defects.

The most successful HBT improvements to date are believed to have been achieved by forming a GaP layer over Si at the base-emitter junction. GaP is desirable because it has a relative large bandgap (i.e. about 2.24 eV) and little lattice mismatch with silicon (i.e. about 0.34%). Nevertheless, such conventional HBTs that use a GaP layer over Si still achieve only a small portion of the performance benefits that HBTs theoretically promise. The reason for this poor performance appears to be that a Si—GaP junction suffers from an unusually large amount of interdiffusion, where the Ga and P readily diffuse into the Si, and vice-versa. The interdiffusion between Si and GaP results in a poor semiconductor junction, with the metallurgical junction being displaced from the electrical junction. Accordingly, the performance gains that are suggested by the wide bandgap difference between a Si base and a GaP emitter are not achieved in practice because the resulting diffuse junction negates those potential gains.

In the field of photoelectric semiconductors, it is desirable to form compound structures using a Si substrate and direct gap semiconductor materials. A Si substrate is desirable for mechanical stability and because a manufacturing infrastructure exists for reliably mass producing rugged Si wafers at relatively low cost. The Si substrate is typically an extrinsic part of the photoelectric semiconductor not used in forming intrinsic photoelectric semiconductor junctions.

In an IEEE article entitled "Si/SiGe Epitaxial-Base Transistors—Part II: Process Integration and Analog Applications", written by D. L. Harame, J. H. Comfort, J. D. Cressler, E. F. Crabbe, J. Y.-C. Sun, B. S. Meyerson and T. Tice, published in 1995, disclosed are conventional techniques for manufacturing super self-aligned transistors.

Another prior art technique is disclosed in U.S. Pat. No. 5,962,879 to Ryum et al. This Patent employs methods that are theoretically simple yet very difficult to perform in practice. FIGS. 4C and 4D show the plurality of layers that must be finely etched in order to create the transistor. It is also noted that the base region of this transistor is quite large and therefore unwanted diffusion and capacitance problems result. These unwanted effects will decrease the transistors power gain and frequency response. The process steps described in U.S. Pat. No. 5,962,879 also allows silicide material to come in direct contact with the active base region and the removal of this material in the active base regions (necessary to obtain a functional npn) is quite difficult without adding additional processing defects.

Therefore, there is a need for a method for forming a super self-aligned heterojunction bipolar transistor that still maintains favorable electrical characteristics.

SUMMARY OF THE INVENTION

The present invention solves the needs addressed above. The present invention provides a method for forming a super self-aligned heterojunction bipolar transistor. The method includes forming a buried layer in a silicon substrate, isolating by shallow trench isolation, diffusing the collector contact, oxidizing the surface of the substrate, depositing a polysilicon layer with a thickness approximately equal to the thickness of the silicon-germanium base, depositing a layer of oxide, depositing a layer of nitride, forming an emitter window mask, etching the nitride layer previously deposited, etching the oxide layer previously deposited, etching the polysilicon layer that was previously deposited while being selective to the oxide and nitride, implanting a collector that is self-aligned with the emitter window opening, etching the polysilicon horizontally, wet etching the oxide layer, depositing the silicon-germanium layer selectively, depositing the emitter, patterning the emitter, etching the emitter polysilicon, etching the nitride, and implanting an extrinsic base. The critical step of the process is the horizontal etching of the polysilicon layer that allows the base region to be wider than the emitter and collector regions while maintaining the self-alignment of base-collector and emitter-base. This self-aligned base region, slightly larger than the selectively implanted collector and emitter region, provides a substantial improvement over prior art transistors.

BRIEF DESCRIPTION OF THE DRAWINGS

These and other objects, features, and characteristics of the present invention will become apparent to one skilled in the art from a close study of the following detailed description in conjunction with the accompanying drawings and appended claims, all of which form a part of this application. In the drawings:

FIG. 1I is an illustration of steps 17–18 in the method for forming a super self-aligned heterojunction bipolar transistor in accordance with one embodiment of the present invention.

DETAILED DESCRIPTION OF THE PRESENTLY PREFERRED EXEMPLARY EMBODIMENTS

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds, are therefore intended to be embraced by the appended claims.

As is well known in the art, major components of a bipolar transistor include a base, an emitter and a collector. These types of transistors may take a variety of forms, including npn, pnp, lateral pnp. These transistors may be formed using a variety of methods. Such methods are described herein.

Figure 1A:
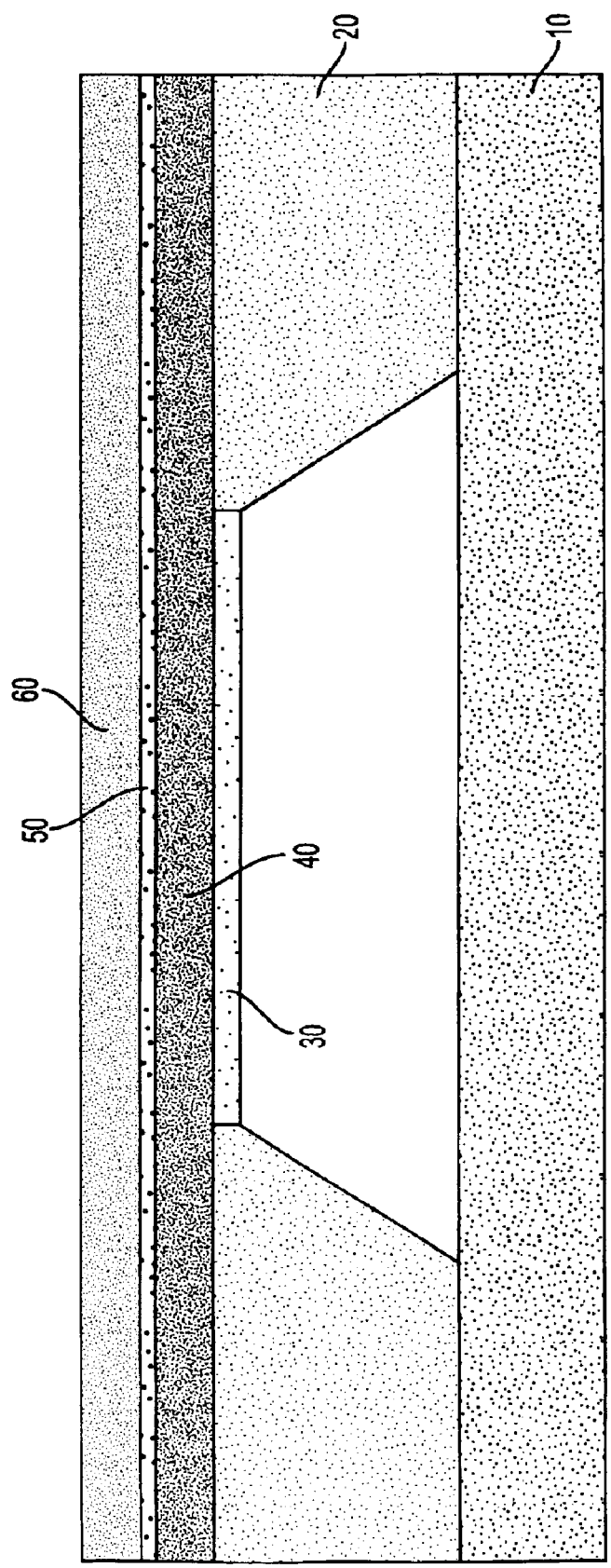
FIG. 1A is a sectional view illustration of steps 1-6 of a method forming a super self-aligned heterojunction bipolar transistor in accordance with one embodiment of the present invention.

FIG. 1A is an illustration of the initial steps of a method forming a super self-aligned heterojunction bipolar transistor in accordance with one embodiment of the present invention. FIG. 1A illustrates the first portions of the processing stage in which a buried region 10 is formed in a silicon (Si) substrate. For an npn implementation, the substrate may be lightly doped P-type conductivity, and buried region 10 is heavily doped through a standard ion implantation process to exhibit N-type conductivity for the implementation. A shallow trench isolation region 20 is formed. The isolation region ensures that adjacent transistors do not electrically contact or interfere with each other and provides for low parasitic capacitance between layers isolated in this manner.

The collector contact is diffused using conventional methods. As is known in the art, diffusion is the process by which impurity atoms, or dopants, are introduced into the silicon to change its dopant concentration. The rate of dopant diffusion in silicon is a strong function of temperature. At high temperatures, such as 800 degrees Celsius to 1200 degrees Celsius, impurities may be introduced into the silicon to obtain the desired doping. The piece of silicon is generally cooled to room temperature and the motion of the impurity atoms becomes essentially stationary. Diffusion may be performed in high-temperature furnaces. Dopants that may be used for this process include boron (P-type) and phosphorus, arsenic or antimony (N-type). In either the case of boron or phosphorus arsenic or antimony, the dopants may be effectively masked by thin silicon dioxide layers. When the boron is diffused into an N-type substrate, a PN junction may be formed, i.e., a diode. A phosphorus, arsenic or antimony diffusion in addition to, and subsequent to, the boron diffusion will produce an NPN structure.

A surface oxide layer 30 would be created in step 3 is illustrated which allows the silicon to react with oxygen to form silicon dioxide. In order to quicken this oxidation process, silicon wafers may be heated to a temperature of 700 degrees Celsius to 1200 degrees Celsius, just as in the diffusion process. Also as in the diffusion process, this heating process may be carried out using special furnaces. Handling of the wafers outside of the ovens should be carried out in a very clean environment. The oxidation process can be carried out with a wet oxide process or a dry oxide process.

A polysilicon layer 40 is deposited onto the surface oxide layer in step 4 of the present process. At a later point in the process, a silicon-germanium layer will be deposited. The thickness of the silicon-germanium layer is known at the time of the deposition of the polysilicon layer 40. The thickness of the polysilicon layer is also determined by the thickness of the silicon-germanium layer to be later deposited. The thickness of this polysilicon layer 40 is approximately equal to the thickness of the silicon-germanium base. This layer is heavily and uniformly doped either in-situ during the deposition or by conventional ion implant and anneals. Prior art layers of this type may result in nonuniform doping and uneven resistance characteristics.

An oxide layer 50 is deposited on top of the polysilicon layer 40 in step 5 and further a Nitride layer 60 is deposited on layer 50 in step 6. Although the first six steps in the present invention rely on conventional techniques, the ordering of these layers results in benefits and advantages that prior art methods do not realize. These multiple layers are used primarily for etch stopping purposes. It is also noted that prior art methods may pattern these different types of layers sequentially therefore substantially adding to the overall processing time and cost.

Figure 1B:
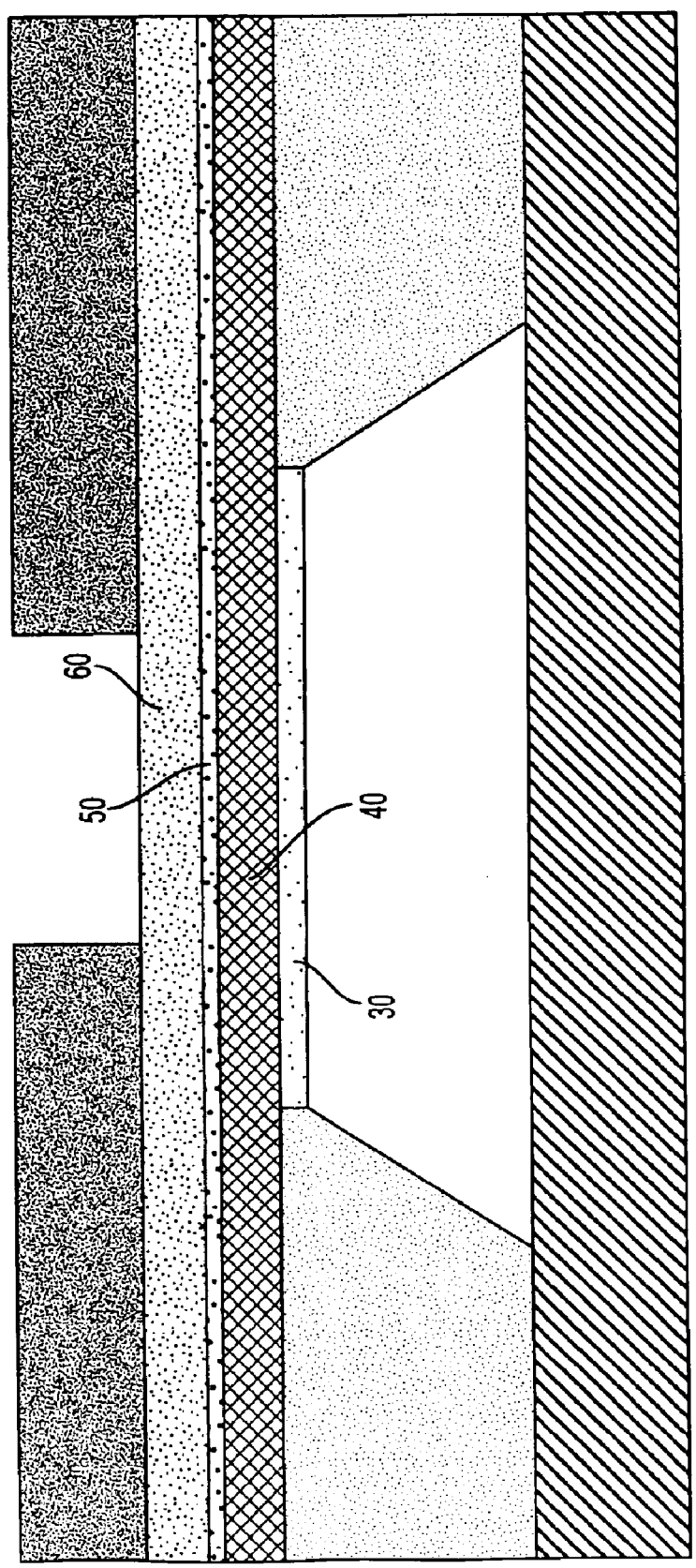
FIG. 1B is an illustration of step 7 of forming an emitter window mask as part of the method for forming a super self-aligned heterojunction bipolar transistor in accordance with one embodiment of the present invention.

Referring now to FIG. 1B, illustrated is the step of forming an emitter window mask as part of the method for forming a super self-aligned heterojunction bipolar transistor. In accordance with one embodiment of the present invention the emitter window mask is formed above the Nitride layer 60. This step would be step 7 in the overall manufacturing process. The emitter mask will essentially determine the emitter to base area and the width of the active regions of the collector. This is therefore critical in determining the transistor characteristics such as current carrying capacity. This single step is simultaneously used to define the emitter-base area, the area of the active collector, and the area of the active base region, all in a self-aligned manner.

Figure 1C:
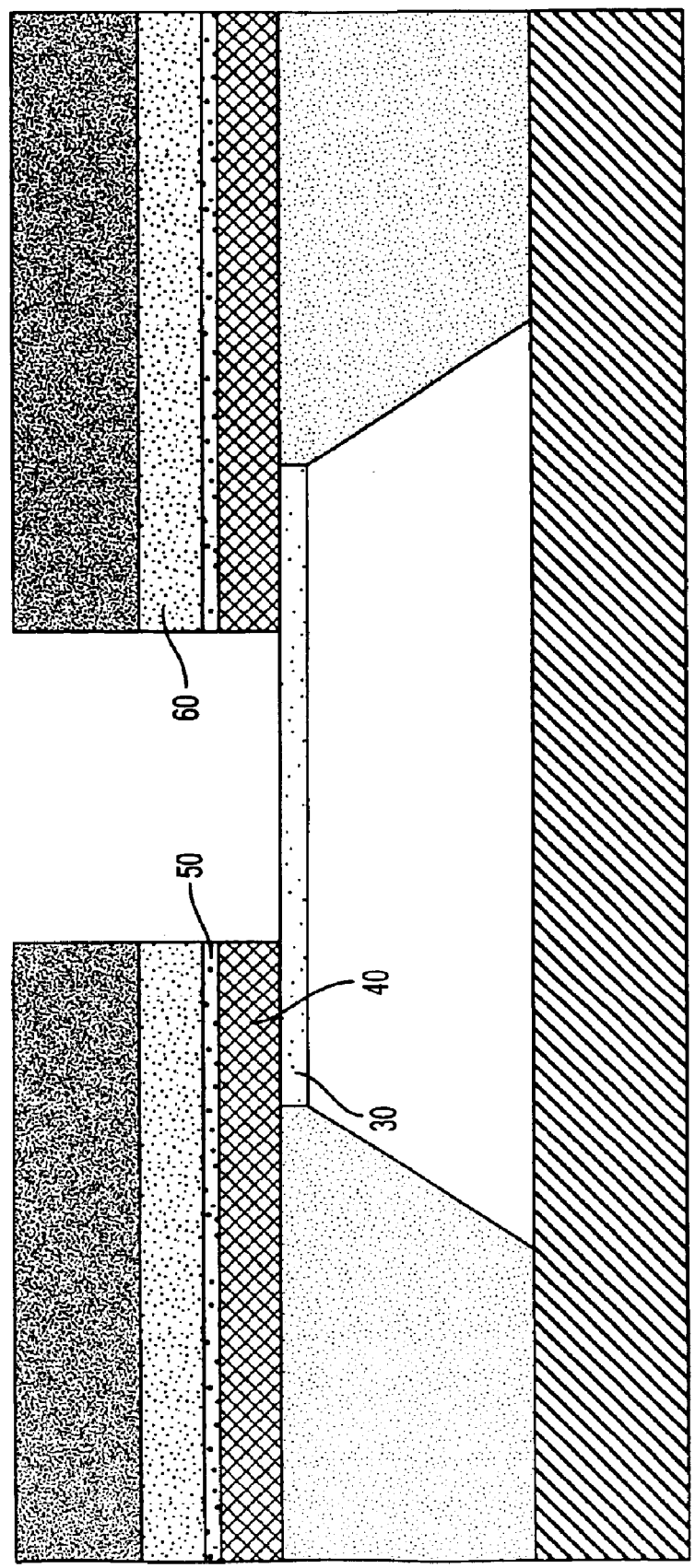
FIG. 1C is an illustration of intermediate etching steps 8-10 of a method for forming a super self-aligned heterojunction bipolar transistor in accordance with one embodiment of the present invention.

FIG. 1C is an illustration of some intermediate etching steps 8-10 of the present method. Once the emitter mask has been formed in step 7, 3 separate etches are implemented. The first etch removes the Nitride layer 60 in step 8 and stops on the Oxide layer. In step 9, the Oxide layer 50 is removed until the polysilicon layer 40 is reached. In step 10 the polysilicon region 40 is etched until the surface oxide layer 30 is reached. These 3 etchings are each done separately by different techniques as the difference in chemical composition of each layer requires different etchings. The techniques used for example would be wet etching with hydrofluoric acid solutions for thin oxide layers, or plasma etching methods used for thicker silicon nitride or silicon dioxide layers. The benefit of this process is that the multiple etching allows for precise control of vertical etch depth because the etching will essentially stop when the relevant etch-stop layer is exposed. In other words, alternating the composition of the layers requires and results in a more manufacturable process.

Figure 1D:
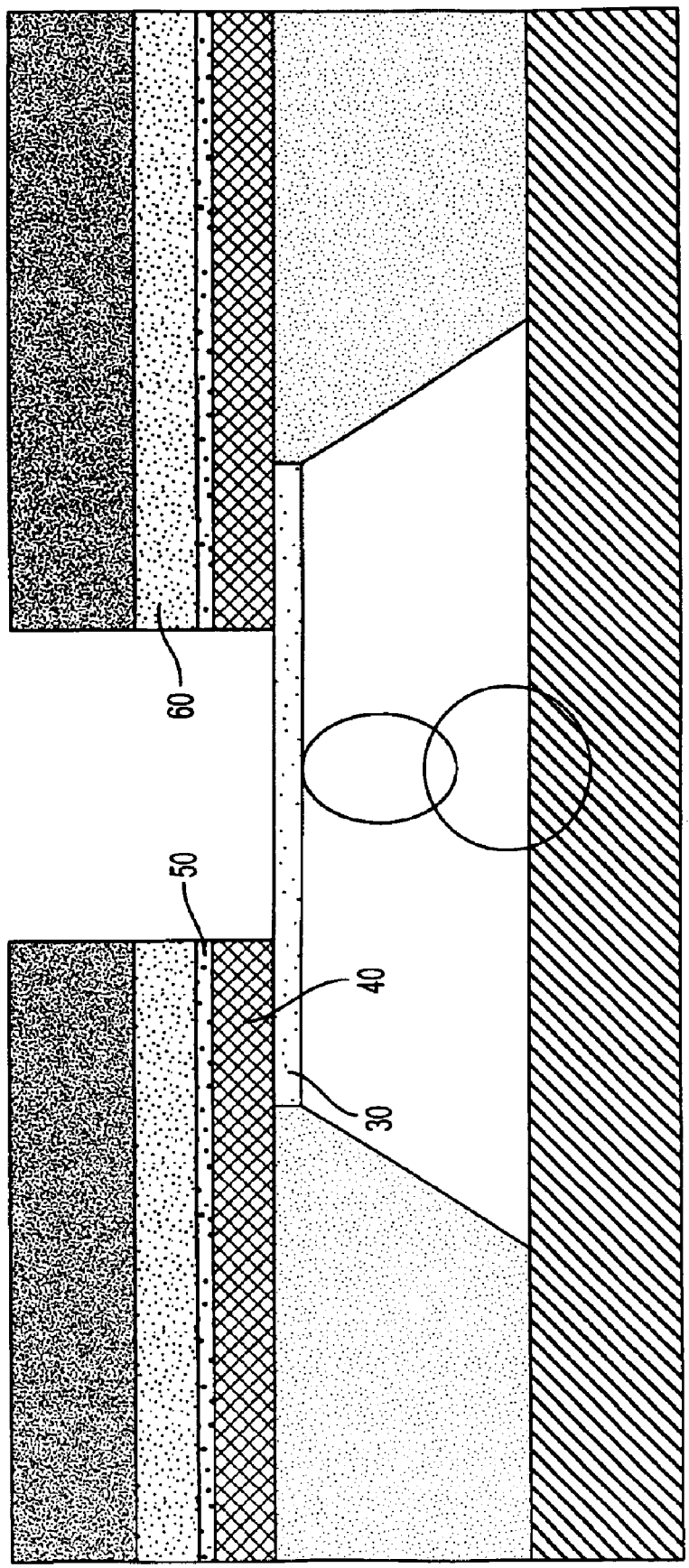
FIG. 1D is an illustration of step 11 of implanting a collector as part of the method for forming a super self-aligned heterojunction bipolar transistor in accordance with one embodiment of the present invention.

FIG. 1D is an illustration of the step 11 of the present invention. Step 11 consists of doping the collector with phosphorus or arsenic (any n-type dopant, assuming the device in question is an npn type transistor). As is conventional, a highly doped collector region increases the gain and current carrying capacity of the device. The emitter mask formed in step 7 previously ensures that the doped region of the collector will be the same width as the emitter area. This produces the super self-aligned structure as desired. It is noted that conventional methods would not dope the collector at this point in the process.

Figure 1E:
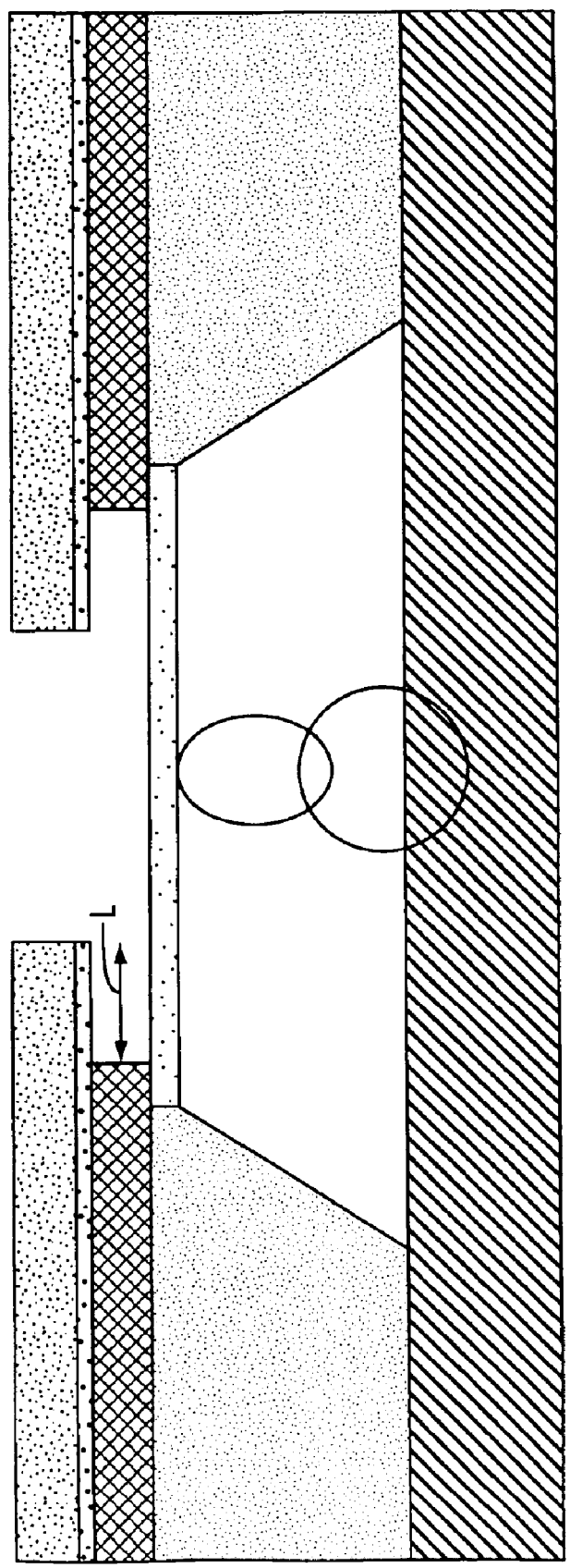
FIG. 1E is an illustration of etching step 12 in the method for forming a super self-aligned heterojunction bipolar transistor in accordance with one embodiment of the present invention.

FIG. 1E is an illustration of the critical etching steps in the method for forming a super self-aligned heterojunction bipolar transistor. In step 12 the polysilicon layer 40 is etched laterally. This etching removes layer 40 and in this area the base region of the transistor will be formed. As was described above the layer 40 is heavily doped in order to reduce the base resistance of the transistor. There is however a limit on how heavily this area can be doped as determined by transistor voltage breakdown. Prior art super self-aligned structures do not perform this step of lateral etching to create the base region. Prior art methods would have the emitter, base and collector regions all exactly the same width as determined by the emitter mask dimensions. Additionally, the technique described here allows for precise self-aligned control of the extrinsic (heavily doped) base region to intrinsic (lightly doped) base region. This is an important advantage for base resistance reduction and control. The problems of prior art devices arise when the polysilicon layer 40 diffuses into the base region. This increases base resistance and lowers power gain of the transistor. By isotropically laterally etching a length L, the polysilicon layer 40 is moved away from the active base region where the bulk of the current will flow. This ensures favorable base region operation with low recombination current and high gain. It is also a feature of the present invention that transistor breakdown characteristics are enhanced. By removing the polysilicon layer 40 away from the active collector region, transistor breakdown voltage is increased (increased BVcbo, BVceo, BVces, BVecs, BVebo). This further reduces capacitance effects between the base and collector regions. A reduction in this capacitance will increase the frequency response of the device. In particular, the unity power gain frequency (Fmax) will be increased. Prior art methods do not approach the present inventions' level of control over the base region size. By varying the distance L, the base region may be conformed to provide the desired electrical characteristics. For example a larger L may result in better gain while a smaller L may result in better frequency response (through reduction in base resistances). This allows for substantial improvements in device manufacturing. By properly selecting the distance L, the transistor gain and frequency response may be optimized. The horizontally etched region allows the space between active and inactive base regions to be precisely controlled. This step also allows the controlled spacing of extrinsic to active emitter and collector regions Another advantage of the present invention is that creating a larger base region by horizontal etching allows for the collector region to be more heavily doped since the self-aligned nature of the selectively implanted collector region (SIC)—active base will avoid the extrinsic base region of low breakdown. As was described above in step 11, the collector is doped with phosphorus or arsenic in order to improve the gain characteristics, improve the maximum current carrying capacity and speed ($f_T$ of the transistor) and power gain ($f_{max}$).

Figure 1F:
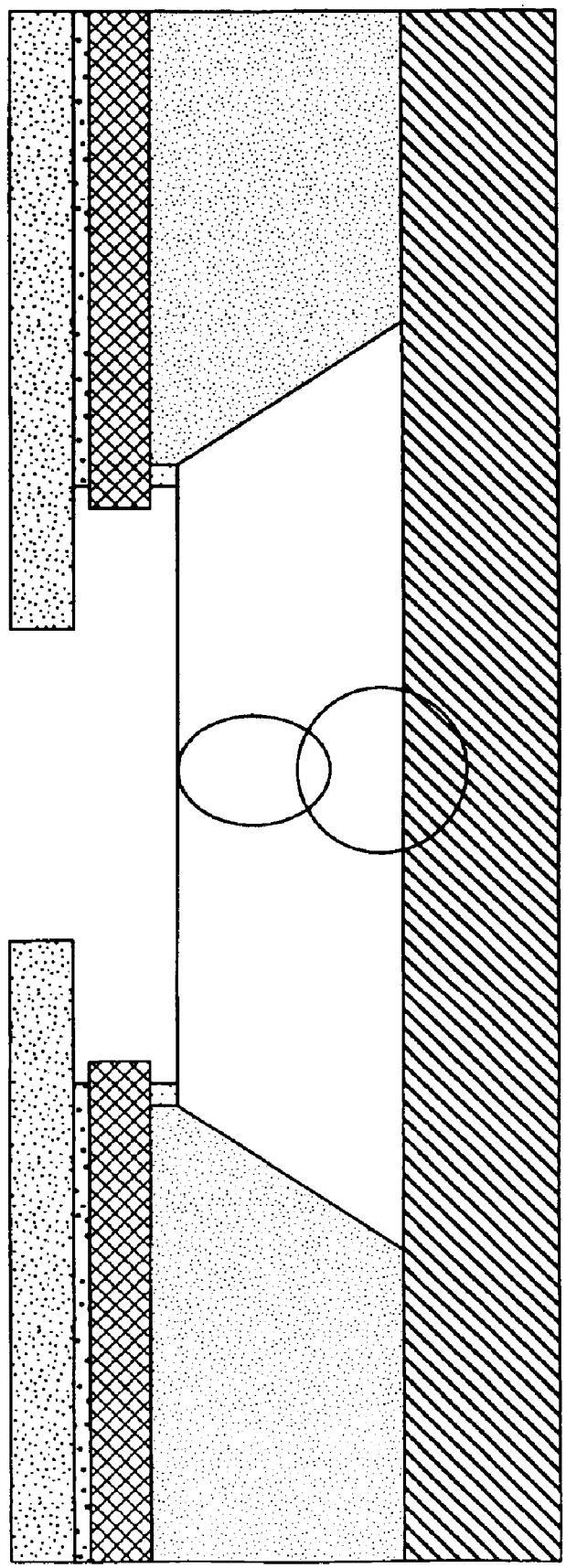
FIG. 1F is an illustration of an additional etching step 13 in the method for forming a super self-aligned heterojunction bipolar transistor in accordance with one embodiment of the present invention.

FIG. 1F is an illustration of etching step 13 in the present method. This step removes the surface oxide layer 30 that has shielded the collector region up to this point. This process is performed by a wet etching to avoid any residual damage to the silicon surface that is exposed. It is noted that at this point in the process, the collector region surface has not seen any type of processing which greatly improves transistor yield and leakage current. Additionally, step 13 prepares the collector surface for the SiGe deposit that will form the base region of the transistor.

Figure 1G:
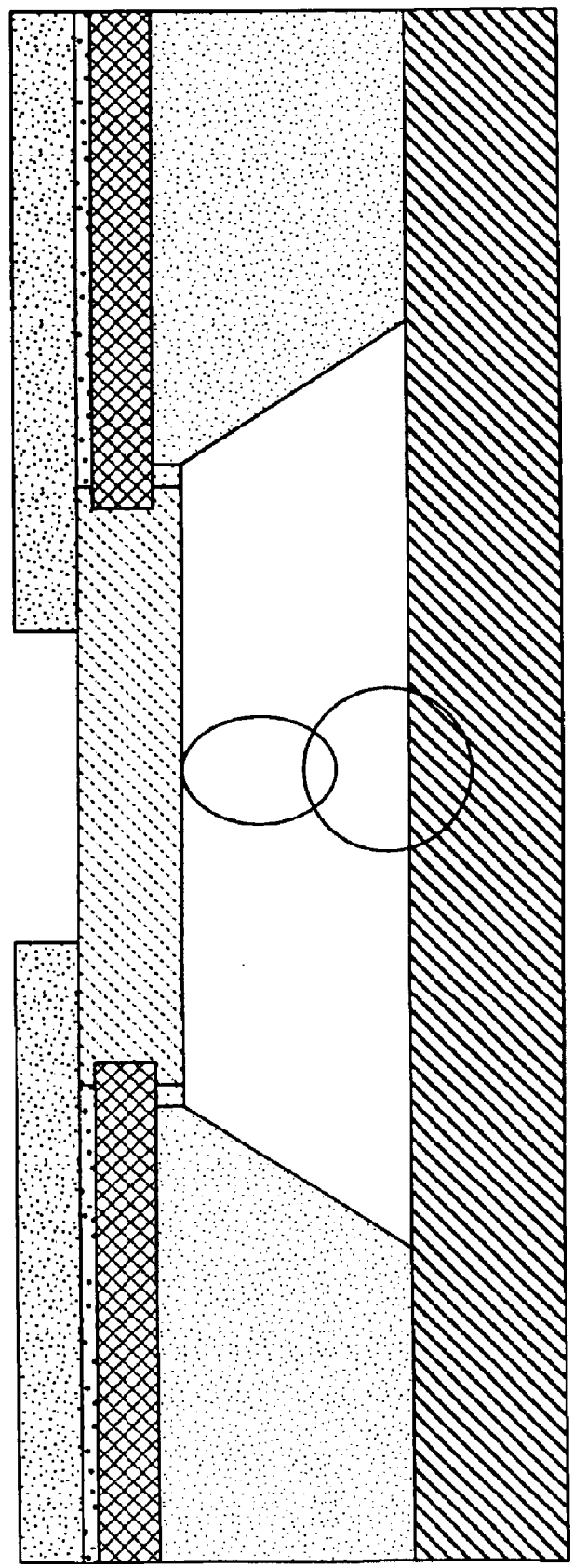
FIG. 1G is an illustration of a selective SiGe step 14 in the method for forming a super self-aligned heterojunction bipolar transistor in accordance with one embodiment of the present invention.

FIG. 1G shows the selective depositing (using chemical vapour deposition techniques) of SiGe that forms the base region. The selective deposition of this active base region allows the doping profile to be tailored for the active device only, without regard to the requirements of the extrinsic base region (which should be very highly doped for low resistance). This would be step 14 in the overall process.

Figure 1H:
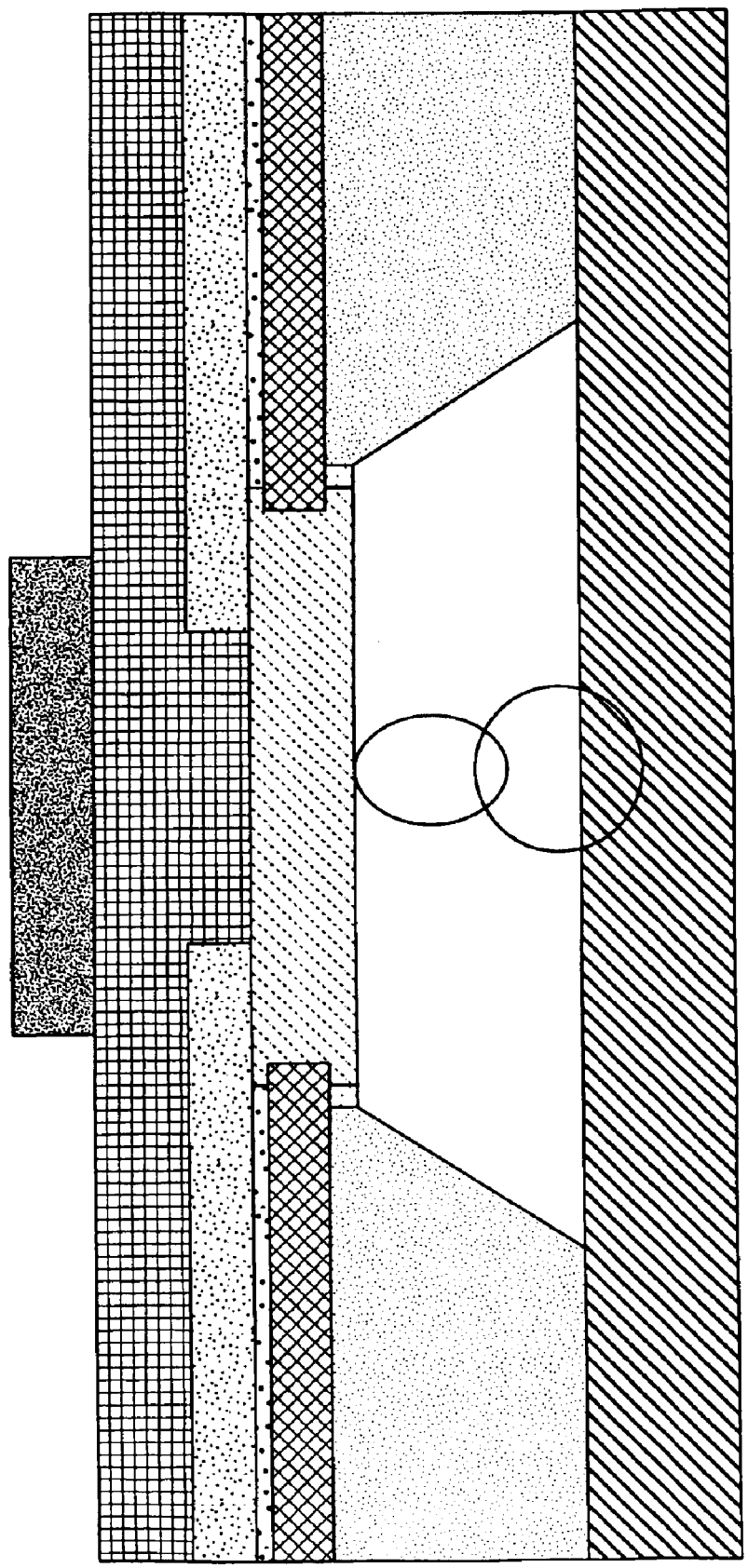
FIG. 1H is an illustration of emitter deposition, doping and patterning which represent steps 15–16 in the method for forming a super self-aligned heterojunction bipolar transistor in accordance with one embodiment of the present invention.
Figure 11:
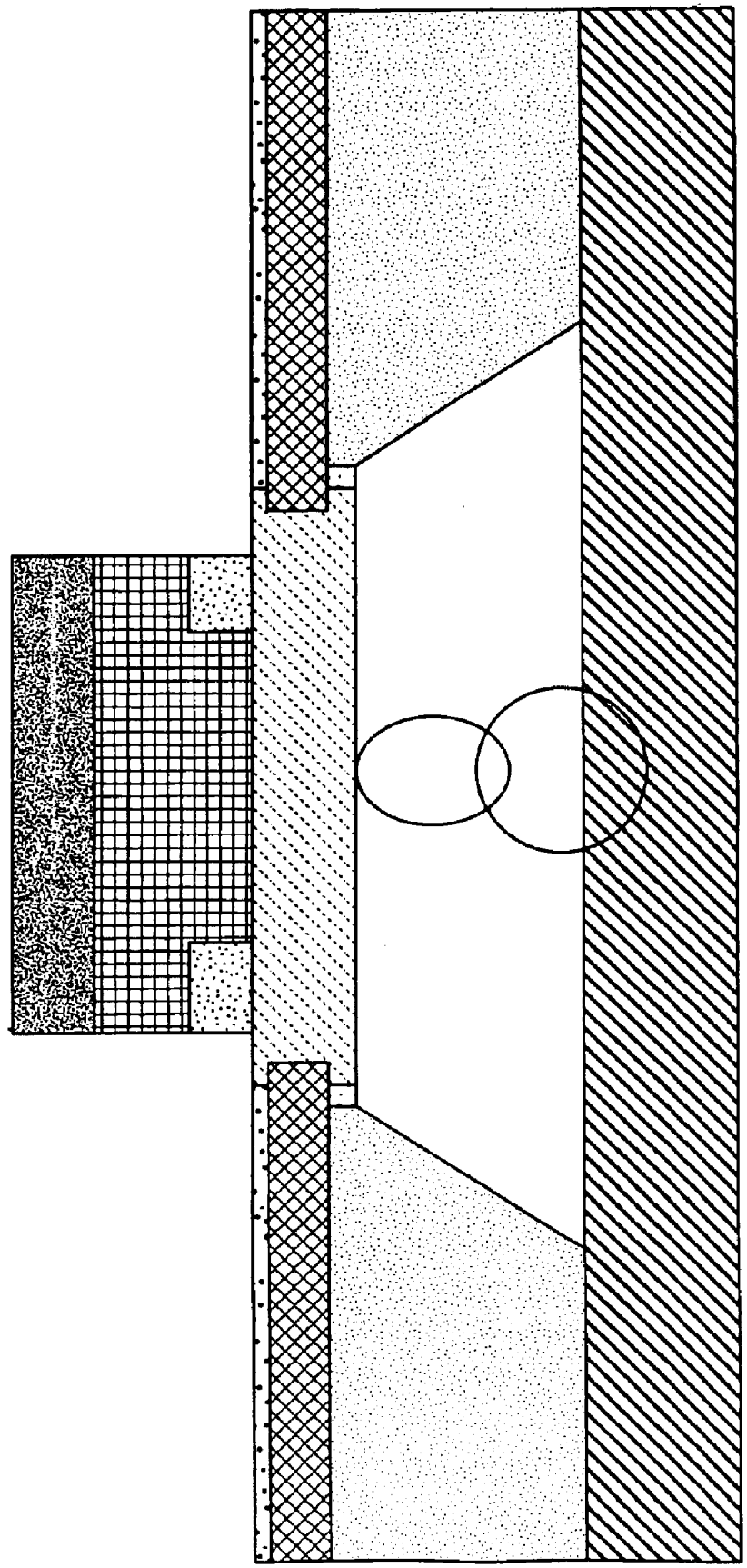

FIG. 1H is an illustration of the formation of the emitter region of the transistor. Step 15 shows depositing the emitter area while step 16 shows emitter doping. The emitter doping could be either in-situ during the emitter deposition or through conventional ion-implantation techniques. An annealing step is normally required to activate the emitter dopant.

FIG. 1I shows the final processing steps 17-18. These steps consist of patterning and etching the emitter and then (optionally) implanting the extrinsic base material to further lower the extrinsic base resistance.

The above steps provide substantial benefits over conventional methods of forming super self-aligned devices. The order of the steps, the compounds used, and the etching processes, combine to form a transistor whose electrical characteristics surpass current standards.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for forming a super self-aligned bipolar transistor, comprising the steps of:
   providing a semiconductor substrate having a buried collector region;
   providing multiple layers above said collector region;
   providing an emitter window mask above said multiple layers;
   providing three vertical etchings of said multiple layers;
   providing a doping of said collector region wherein the doped collector region is determined by the emitter window mask;
   providing a horizontal etching of one of said multiple layers, wherein said horizontally etched layer is a polysilicon layer and is etched a distance greater than a thickness of said polysilicon layer;
   providing a wet etching to remove a final one of said multiple layers;
   providing a base region above said collector region in the horizontally etched area; and
   providing an emitter region above the base region so that the emitter, base and collector regions are super self-aligned wherein said horizontal etching determines that a dimension of said base region is wider than a dimension of said doped collector region and a dimension of said emitter region.

2. The method as described in claim 1 wherein the step of providing a horizontal etching determines that the dimensions of the base region are wider than the dimensions of the doped collector region and the emitter region.

3. The method as described in claim 1 further comprising the step of providing a surface oxide layer and polysilicon layer as 2 of the multiple layers.

4. The method as described in claim 3 further comprising the step of providing an oxide layer and a Nitride layer above said layers of surface oxide and polysilicon.

5. The method as described in claim 1 further comprising the step of doping the collector region with phosphorus or arsenic, using ion implantation.

6. The method as described in claim 1 further comprising the step of using an isotropic plasma etch to perform said wet etching.

7. A super self-aligned bipolar transistor, comprising:
   a semiconductor substrate having a buried collector region;
   multiple layers above said collector region;
   an emitter window mask above said multiple layers;
   a doped collector region wherein the width of the doped collector region are equal to the emitter window mask width;
   a horizontal etched region of one of said multiple layers, wherein said horizontally etched region is a polysilicon region and extends a distance greater than a thickness of said polysilicon region;
   a base region above said collector region in the horizontally etched area;
   an emitter region above the base region so that the emitter, base and collector regions are super self-aligned wherein said horizontally etched region determines that a dimension of said base region is wider than a dimension of said doped collector region and a dimension of said emitter region; and
   an oxide layer and a Nitride layer above said multiple layers.

8. The apparatus as described in claim 7 wherein the horizontally etched region allows the space between active and inactive base regions to be precisely controlled and also allows the spacing of extrinsic to active emitter and collector regions to be controlled.

9. The apparatus as described in claim 8 wherein the multiple layers have been etched to the same width as the emitter and collector regions.

10. The apparatus as described in claim 9 wherein the dimensions of the doped region of the collector is the same as the dimension of the emitter region.

11. A method for forming a super self-aligned bipolar transistor, comprising the steps of:
   providing a semiconductor substrate having a buried collector region;
   providing a first oxide layer, a polysilicon layer and a second oxide layer above said collector region;
   providing a Nitride emitter window mask above said oxide and polysilicon layers;
   providing a wet etching with hydrofluoric acid solutions to etch first and second oxide layers;
   providing a doping of said collector region wherein the doped collector region is determined by the emitter window mask;
   providing a horizontal etching of said polysilicon layer, wherein said horizontal etching is etched a distance greater than a thickness of said polysilicon layer;

providing a base region above said collector region in the horizontally etched area wherein the base region extends horizontally beyond the doped collector region; and providing an emitter region above the base region so that the emitter, base and collector regions are super self-aligned wherein said horizontal etching determines that a dimension of said base region is wider than a dimension of said doped collector region and a dimension of said emitter region.

12. The method as described in claim 11 further comprising the step of predetermining the length of the horizontally etched region in order to optimize at least one of frequency response or power gain of the super self-aligned bipolar transistor.

13. The method as described in claim 1 further comprising the step of predetermining the length of the horizontally etched region in order to optimize at least one of frequency response or power gain of the super self-aligned bipolar transistor.

14. A method for forming a super self-aligned bipolar transistor, comprising the steps of:

providing a semiconductor substrate having a buried collector region;

providing multiple layers above said collector region;

providing an emitter window mask above said multiple layers;

providing three vertical etchings of said multiple layers;

providing a doping of said collector region wherein the doped collector region is determined by the emitter window mask;

providing a horizontal etching of one of said multiple layers, wherein said horizontal etching is performed to a distance greater than a thickness of said polysilicon and whereby said distance may be conformed to provide desired electrical characteristics;

providing a wet etching to remove a final one of said multiple layers;

providing a base region above said collector region in the horizontally etched area; and providing an emitter region above the base region so that the emitter, base and collector regions are super self-aligned wherein said horizontal etching determines that a dimension of said base region is wider than a dimension of said doped collector region and a dimension of said emitter region.

15. The method of claim 14 wherein the desired electrical characteristics are transistor gain and frequency response.

* * * * *